United States Patent [19]
Inada et al.

[11] Patent Number: 5,833,761
[45] Date of Patent: *Nov. 10, 1998

[54] METHOD OF CLEANING AN OBJECT INCLUDING A CLEANING STEP AND A VAPOR DRYING STEP

[75] Inventors: Minoru Inada, Yokohama; Kimiaki Kabuki, Tokyo; Yasutaka Imajo, Hachioji; Noriaki Yagi, Yokohama; Nobuhiro Saitoh, Ohta, all of Japan

[73] Assignee: Toshiba Silicone Co., Ltd., Tokyo, Japan

[*] Notice: The term of this patent shall not extend beyond the expiration date of Pat. No. 5,503,681.

[21] Appl. No.: 475,080

[22] Filed: Jun. 7, 1995

Related U.S. Application Data

[62] Division of Ser. No. 177,697, Jan. 4, 1994, Pat. No. 5,503,681, which is a continuation of Ser. No. 768,554, filed as PCT/JP91/00359 Mar. 15, 1991, abandoned.

[30] Foreign Application Priority Data

Mar. 16, 1990 [JP] Japan .................................. 2-065837

[51] Int. Cl.$^6$ .............................. B08B 3/08; B08B 3/10; B08B 7/04
[52] U.S. Cl. ................................. 134/10; 134/26; 134/30; 134/37; 134/40
[58] Field of Search ................................. 134/10, 26, 30, 134/28, 31, 40, 37, 42; 252/174.15, 94; 570/161, 163, 165, 166, 167, 175, 179, 244, 245, 254, 364, 407, 466

[56] References Cited

U.S. PATENT DOCUMENTS 3,120,853  2/1964  Kearney et al. .......................... 134/74
3,193,499  7/1965  Carr ....................................... 252/8.55

(List continued on next page.)

FOREIGN PATENT DOCUMENTS

| 0 160 854 | 11/1985 | European Pat. Off. . |
| 0 182 583 | 5/1986 | European Pat. Off. . |
| 0 183 109 | 6/1986 | European Pat. Off. . |
| 0 199 288 | 10/1986 | European Pat. Off. . |
| 0 334 384 | 9/1989 | European Pat. Off. . |
| 0 350 316 | 1/1990 | European Pat. Off. . |
| 0 351 185 | 1/1990 | European Pat. Off. . |
| 0 352 753 | 1/1990 | European Pat. Off. . |
| 0 381 887 | 8/1990 | European Pat. Off. . |
| 0 422 787 | 4/1991 | European Pat. Off. . |

(List continued on next page.)

OTHER PUBLICATIONS

Abstract, vol. 013, No. 275 (C–610), 23 Jun. 1989 & JP 01 070047 A (Nitto Electric Ind. Co. Ltd.) 15 Mar.
Abstract, vol. 012, No. 148 (C–493), 7 May 1988 & JP 62 263279 A (Mitsubishi Chem. Ind., Ltd.), 16.

(List continued on next page.)

Primary Examiner—Jill Warden
Assistant Examiner—Saeed Chaudhry
Attorney, Agent, or Firm—Foley & Lardner

[57] ABSTRACT

An object to be cleaned is cleaned with an cleaning agent which mixes a base cleaning agent such as silicon-containing cleaning agent or an isoparaffin containing cleaning agent with a surfactant or a hydrophilic solvent to promote the cleaning power. The object is rinsed with the base cleaning agent alone after it goes through the first cleaning step as described above. Then, this is followed by the finishing treatment by the use of hot air or steam drying. The base cleaning agents can be recovered and recycled, improving economy in the case with the use of two or more cleaning agents in combination. The excellent properties of degreasing and dewatering, comparable to those of flon system, can be obtained using a mixture of silicon-containing or isoparaffin-containing cleaning agents with surfactants and hydrophilic solvents and maintaining safety in environment.

12 Claims, 2 Drawing Sheets

U.S. PATENT DOCUMENTS

| | | | |
|---|---|---|---|
| 3,249,550 | 5/1966 | Metters | 252/161 |
| 3,498,922 | 3/1970 | Zisman et al. | 252/171 |
| 3,498,923 | 3/1970 | Zisman | 252/171 |
| 3,511,708 | 5/1970 | Zisman | 134/40 |
| 3,516,938 | 6/1970 | Zisman | 252/171 |
| 3,903,012 | 9/1975 | Brandreth | 252/194 |
| 3,904,430 | 9/1975 | Tipping et al. | 134/11 |
| 3,991,481 | 11/1976 | Coraor et al. | 34/28 |
| 3,998,588 | 12/1976 | Coraor et al. | 8/176 |
| 4,091,826 | 5/1978 | Bahrke | 134/12 |
| 4,166,305 | 9/1979 | Gustafsson | 134/30 |
| 4,168,714 | 9/1979 | Bahrke | 134/60 |
| 4,169,807 | 10/1979 | Zuber | 134/30 |
| 4,240,453 | 12/1980 | Viai et al. | 134/107 |
| 4,247,330 | 1/1981 | Sanders, Jr. | 106/3 |
| 4,290,696 | 9/1981 | Gordon | 210/710 |
| 4,290,896 | 9/1981 | Gordon et al. | 210/710 |
| 4,400,288 | 8/1983 | Dhanani et al. | 252/135 |
| 4,501,682 | 2/1985 | Goodman et al. | 252/174.15 |
| 4,677,178 | 6/1987 | Okada et al. | 528/34 |
| 4,685,930 | 8/1987 | Kasprzak | 8/139.1 |
| 4,708,807 | 11/1987 | Kemerer | 252/86 |
| 4,778,532 | 10/1988 | McConnell et al. | 134/10 |
| 4,784,799 | 11/1988 | Petroff | 252/545 |
| 4,795,840 | 1/1989 | Torii et al. | 585/16 |
| 4,810,253 | 3/1989 | Kasprzak et al. | 8/137 |
| 4,960,533 | 10/1990 | Wisniewski et al. | 252/174.15 |
| 4,985,155 | 1/1991 | Yamada et al. | 252/8.6 |
| 5,055,138 | 10/1991 | Slinn | 134/11 |
| 5,080,824 | 1/1992 | Bindl et al. | 252/174 |
| 5,183,067 | 2/1993 | Slinn | 134/61 |
| 5,443,747 | 8/1995 | Inda et al. | 252/94 |
| 5,503,681 | 4/1996 | Inada et al. | 134/1 |

FOREIGN PATENT DOCUMENTS

| | | |
|---|---|---|
| 2 418 034 | 9/1979 | France . |
| 2418681 | 9/1979 | France . |
| 2634799 | 2/1990 | France . |
| 25 41 613 | 3/1924 | Germany . |
| 17 53 849 | 3/1976 | Germany . |
| 3321289 | 12/1984 | Germany . |
| 3739711 | 6/1989 | Germany . |
| 37-6688 | 6/1962 | Japan . |
| 42-22269 | 12/1967 | Japan . |
| 53-56203 | 5/1978 | Japan . |
| 53-132173 | 11/1978 | Japan . |
| 54-118404 | 9/1979 | Japan . |
| 54-124010 | 9/1979 | Japan . |
| 57-115499 | 7/1982 | Japan . |
| 58-34515 | 7/1983 | Japan . |
| 59-17160 | 4/1984 | Japan . |
| 59-39162 | 9/1984 | Japan . |
| 60-28880 | 7/1985 | Japan . |
| 61-119765 | 6/1986 | Japan . |
| 61-146378 | 7/1986 | Japan . |
| 61-231272 | 10/1986 | Japan . |
| 2-46007 | 11/1987 | Japan . |
| 62-273299 | 11/1987 | Japan . |
| 62-286583 | 12/1987 | Japan . |
| 62-286915 | 12/1987 | Japan . |
| 63-15889 | 1/1988 | Japan . |
| 63-107788 | 7/1988 | Japan . |
| 63-50463 | 10/1988 | Japan . |
| 63-63884 | 12/1988 | Japan . |
| 1-239175 | 9/1989 | Japan . |
| 1-304032 | 12/1989 | Japan . |
| 1-311198 | 12/1989 | Japan . |
| 2-73896 | 3/1990 | Japan . |
| 2-184302 | 7/1990 | Japan . |
| 2-191581 | 7/1990 | Japan . |
| 2-91688 | 7/1990 | Japan . |
| 3-042002 | 2/1991 | Japan . |
| 786920 | 12/1980 | Romania . |
| 1053780 | 1/1967 | United Kingdom . |
| 2173508 | 10/1986 | United Kingdom . |
| 2188059 | 9/1987 | United Kingdom . |
| 2238793 | 6/1991 | United Kingdom . |
| 2220951 | 9/1992 | United Kingdom . |
| WO 89/11924 | 12/1989 | WIPO . |
| PCT JA91/ 0035 | 3/1991 | WIPO . |
| 91/06621 | 5/1991 | WIPO . |

OTHER PUBLICATIONS

Handbook of Surface Preparation, R.C. Snogren, (1974), pp. 111–112, 311, 423–425.

Perry's Chemical Engineers Handbook 6th ed., (1984), pp. 20–25.

Encyclopedia Chemical technology, Kirk–Othmer, (1980), vol. 10, pp. 897–900.

Encyclopedia Chemical technology, Kirk–Othmer, (1983), vol. 21, pp. 355–376.

Perry, "Perry's Chemical Engineers Handbook Sixth Edition", Mar. 27, 1987.

Kasprzak, "Volatile Silicones New Cleaners for Oils and Greases", *Soap/Cosmetics/Chemical Specialties*, Dec. 1986, pp. 40–43.

"Actual Conditions of the Selection and Development of Glass Washing Detergent . . ." Soft Gilsen Publication, Mar. 15, 1994.

"Precise Washing Technique Manual", Kabushiki Kaisha Shingijutsu Kaihatsu Center, Jul. 30, 1986.

"Information about Silicone Fluids", Dow Corning Corporation, 1978.

"The Design By Glass Surface," Publisher Kinai Henshusha, 1983, pp. 236–265.

METHOD OF CLEANING AN OBJECT INCLUDING A CLEANING STEP AND A VAPOR DRYING STEP

This application is a divisional of application Ser. No. 08/177,697 filed Jan. 4, 1994, U.S. Pat. No. 5,503,681 which is a continuation of application Ser. No. 07/768,554 filed Sep. 27, 1991, now abandoned which is the national phase of PCT/JP91/00359 filed Mar. 15, 1991.

BACKGROUND OF THE INVENTION

The present invention relates to a cleaning method and a cleaning apparatus using non-water system cleaning agents in place of flon-containing solvents such as flon 113, chlorine-containing solvents and lower alcohols.

DESCRIPTION OF THE RELATED ART

Flon-containing solvents such as flon 113 have been in general use as a dewatering cleaning agent to dry metal parts, plated and coated parts, electronic parts, semiconductor parts and the like after they are washed with water. Meanwhile, these flon-containing solvents and also such organic solvents as trichloroethane, trichloroethylene, tetrachloroethylene and carbon tetrachloride have been widely used as a cleaning agent to remove oil stains and the like.

In recent years, however, it has been established that the discharge of flon leads to destruction of the ozone layer. Since flon 12 and flon 113 have a high ozone destruction coefficient, there has been staged reduction of their use the world over and it is expected that the flons will be totally banned in the not too distant future. Chlorine-containing organic solvents such as trichloroethylene and tetrachloroethylene also are blamed for environmental problems such as contamination of soils and underground waters and the restrains of their use have been more stringent with the elapse of time. Certain attempts reflecting those circumstances have been made to develop substances of flon origin having the ozone destruction coefficient lower than that of their predecessors and, although some of them are in a stage of industrial production now, they are not regarded as a preferable cleaning agent because they do the ozone layer insignificant but positive harm.

Under these circumstances, water system cleaning agents using surfactants or hydrophilic solvents which should not cause ecological destruction or contamination have been thought better of to replace degreasing cleaning agents containing organic solvents. These cleaning agents, however, have a drawback that they have the weak penetrating power, incapable of completely cleaning up stains in narrow spaces of the parts or caked oil stains having a medium to high viscosity.

Meanwhile, many attempts have been made to probe the possibility of developing new cleaning agents by the use of a variety of surfactants to replace organic solvent-containing dewatering cleaning agents but the dewatering effects as good as those of flon solvents have not been obtained as yet. Further, when the abovementioned organic solvent-containing cleaning agents are put to use for the dewatering cleaning purpose, their specific gravity is greater comparatively, resulting in the outcome that not only oils but also water rise to the surface of the cleaning agent and are separated from the cleaning agent while they remain as they are contacted each other. Once they are contacted in that way, the oils and waters are hard to separate. Since they should be discarded each independently, the disposal of waste liquid is a difficult matter. Further, cleaning agents containing surfactant are highly compatible with water, it is virtually impossible to separate, repurify and recycle them.

On the other hand, a cleaning apparatus using conventional type cleaning agents usually comprises a mechanism solely controlling all of various processes of immersing cleaning, vaporizing cleaning, showering cleaning and the like for the purpose of better cleaning efficiency and it is pre-conditioned that only one single cleaning agent but not others is permitted to circulate in the system. This is because the recovery and recycling of cleaning agent are hard to implement when two or more of it are used in combination. The system should be a stumbling block against any attempts, for example to achieve by two or more cleaning agents the cleaning effects that would not be achieved by one of them alone.

Generally speaking, of the conventional type cleaning agents including dewatering cleaning agents, those containing organic solvents such as flon have a drawback that they are blamed for ecological destruction. New cleaning agents investigated as a likely replacement of these organic solvent-containing agents have a drawback that the desired satisfactory effects are missing. On the other hand, the conventional cleaning methods and systems have a drawback that recycling of cleaning agents and the disposal of removed waters and stain substance are a hard job. Further, under these methods and systems, the use of two or more cleaning agents does not go along well with an attempt for efficient repurification and recycling of them.

The present invention has been accomplished for the purpose of finding a solution to the above-mentioned problems incidental to the conventional type cleaning methods and cleaning apparatus and the object of the present invention is to provide a new cleaning method and a new cleaning apparatus which make it possible to use more than one cleaning agents in combination and at the same time to recycle them. Another object of the present invention is to provide a new cleaning method and a new cleaning apparatus which make it possible to efficiently dispose of waters and stain substances that are removed from objects to be cleaned. Still another object of the present invention is to provide a new cleaning method and a new cleaning apparatus which should bring forth the cleaning power, water substitutability and the drying power which are as good as those achieved when cleaned with flon-containing solvents.

SUMMARY OF THE INVENTION

The cleaning method of the present invention is characterized by comprising the first cleaning step wherein an object to be cleaned is cleaned with a mixture of base cleaning agent with cleaning power promoting agent and the second cleaning step wherein the object is cleaned with the base cleaning agent alone after it goes through the first cleaning step.

Specific examples of cleaning agent for use in the first cleaning step of the present invention include dewatering cleaning agent capable of separating waters and degreasing cleaning agent intended for use in removing oil stains. Specific examples of base cleaning agent as used herein include non-water system cleaning agent such as silicon-containing cleaning agent and isoparaffin-containing cleaning agent. But a variety of cleaning agents other than these can also be used herein as the need arises. Specific examples of cleaning power promoting agent include surfactant and hydrophilic solvent which provide or improve the cleaning or dewatering power in combination with the non-water system cleaning agents. Further, the second cleaning step of the present invention fundamentally is a step of rinsing by the use of the base cleaning agent.

A silicon-containing cleaning agent enumerated as a non-water system cleaning agent above is, for example a composition substantially comprising at least one low molecular weight polyorganosiloxane selected from the group consisting of straight chain polydiorganosiloxane represented by the general formula:

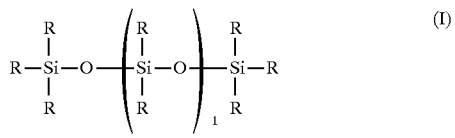

(wherein R is a hydrocarbon group of single valence substituted by the same or different group or unsubstituted and 1 is an integer of from 0 to 5) and cyclic polydiorganosiloxane represented by the general formula:

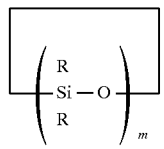

(wherein R is a hydrocarbon group of single valence substituted by the same or different group or unsubstituted and m is an integer of from 3 to 7).

The above-mentioned low molecular weight polyorganosiloxane singly exhibits the excellent penetrating or volatilizing power in narrow spaces of objects to be cleaned such as metal parts, electronic parts, semiconductor parts, coated parts and the like, providing the rust-preventive properties, substituting waters well and vaporizing and drying with a hot air at 60° C. or lower. Further, the straight chain polydiorganosiloxane represented by the general formula (I) and the cyclic polydiorganosiloxane represented by the general formula (II) may be used in combination.

R in the above-mentioned general formulae (I) and (II) is a substituted or unsubstituted hydrocarbon group of single valence, including alkyl group such as methyl group, ethyl group, propyl group and butyl group, unsubstituted hydrocarbon group of single valence such as phenyl group and substituted hydrocarbon group of single valence such as trifluoromethyl group, but a methyl group is most preferable in order to keep the system stable and volatility continuing for a certain period of time. Of the above-mentioned low molecular weight polyorganosiloxane, those having the cyclic structure are preferable, and octamethylcyclotrisiloxane, decamethylcyclopentasiloxane and mixture thereof are especially well suited.

By choosing the desired molecular structure of the above-mentioned low molecular weight polyorganosiloxane, its cleaning agent can be made to have specific gravity Ddg satisfying the following formula (A) or (B):

$Wdg > Ddg$     (A)

$Wdg > Ddg > Odg$     (B)

(wherein Ddg is specific gravity of the base cleaning agent, Wdg is specific gravity of water and Odg is specific gravity of oil stains to be cleaned.)

For example, when the Formula (B) is satisfied, water and oil stains can be separated and repurification of cleaning agents and the disposal of liquid wastes are carried out with ease.

As the above-mentioned isoparaffin-containing cleaning agent, compositions substantially comprising volatile isoparaffins having from 1 to 30 carbon atoms can be mentioned and particularly isoparaffins chiefly comprising $C_3$–$C_{15}$ cut are preferable from the viewpoint of the cleaning power. An isoparaffin containing cleaning agent usually comprises one or two or more of the above-mentioned volatile isoparaffins. These isoparaffins are volatile, harmless and odorless, achieving substantially as good effects as the above-mentioned low molecular weight polyorganosiloxane.

Further, silicon-containing and isoparaffin-containing cleaning agents which are mentioned as the base cleaning agent respectively are used singly but their mixture can also be used as a base cleaning agent. For example, a silicon-containing cleaning agent mixed with an isoparaffin-containing cleaning agent exhibits the effect of providing a very low freezing point, is well suited for use in cold areas and improves the cleaning power as well.

As mentioned above, specific examples of cleaning power improving agent to be mixed with base cleaning agents include surfactant and hydrophilic solvent. Surfactants are divided into cationic, anionic, nonionic, amphoteric and mixture types, depending upon their activating chemical structure. Every one of them can be used in connection with the present invention, contributing to the increase of the cleaning power.

Well suited for the present invention among these surfactants are anionic surfactants such as polyoxyalkylene alkylether sulfonate and phosphoric ester, nonionic surfactants such as polyhydroxy alcohol fatty acid ester, polyoxyalkylene fatty acid ester and polyoxyalkylene alkylether, amphoteric surfactants such as imidazoline derivative and cationic surfactants such as alkylamine salt and alkyl quaternary ammonium salt. Terpene compounds extracted from the natural sources where their distribution as single substance is rare and higher fatty acid esters can also be mentioned. There are also mentioned the synthetic compounds which are derived from the abovementioned compounds by substituting a part of their chemical structure with a fluorine or silicon atom.

As the hydrophilic solvent, those compatible with above-mentioned base cleaning agents and especially having the flash point of 40° C. or higher are well suited for the practical use. Specific examples of hydrophilic solvents include polyhydroxy alcohol and its derivatives such as ethylene glycol monomethyl ether, ethylene glycol monoethyl ether, ethylene glycol monopropyl ether, ethylene glycol monobutyl ether, ethylene glycol monobutyl ether acetate and diethylene glycol monobutyl ether, and of them diethylene glycol monobutyl ether is particularly preferable on account of its compatibility with base cleaning agents and safety in the human. These compounds should have an improved volatility if in coexistence with low molecular weight polyorganosiloxane and the like, and even water substitution and drying stepes can be completed with their mixture alone. Further, lower alcohols such as ethyl alcohol or acetone or the like can be used in combination with base cleaning agents depending upon the latter's kind and uses. Further, a polyoxyalkylene alkylether represented by the formula:

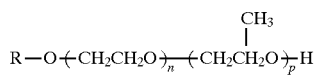

(wherein R is a hydrocarbon group of single valence having from 1 to 12 carbon atoms and n and p respectively are an integer of from 0 to 10, satisfying the formula n+p 1) is especially well suited for in the case where an isoparaffin-containing cleaning agent is used as a base cleaning agent.

The above-mentioned base cleaning agents and cleaning power improving agents are used in the following ways: fundamentally, a mixture of base cleaning agent with cleaning power improving agent is used in the first cleaning step and a base cleaning agent alone in the second cleaning step, but different ways are possible as well depending upon the use of agents and the purpose of the subsequent step. Base cleaning agents and cleaning power promoting agents can be combined in various ways according to their use. For example, a mixture of base cleaning agent with surfactant or hydrophilic solvent or a mixture of these three is well suited as a degreasing cleaning agent. When an isoparaffin-containing cleaning agent is intended for use as the base cleaning agent, it may be put to use singly. It is acceptable as well that a mixture of silicon-containing and isoparaffin-containing cleaning agents is a base cleaning agent and this base cleaning agent further is mixed with one of above-mentioned cleaning power promoting agents. As the dewatering agent, a base cleaning agent can be used singly, but preferably a surfactant or hydrophilic solvent is added to it. Especially the addition of a hydrophilic solvent is more preferable. As the rinsing cleaning agent, a base cleaning agent is used singly in principle, but the addition of a hydrophilic solvent is acceptable as so is the addition of a trace amount of a surfactant if required by the subsequent stepes. Further, the base cleaning agent in the first cleaning step need not be necessarily identical to its counterpart of the second step and for example it is quite probable that a silicon-containing cleaning agent is used as the base cleaning agent in the first cleaning step and an isoparaffin-containing cleaning agent in the second cleaning step.

Base cleaning agents and cleaning power promoting agents can be used in various combinations as mentioned above and it is preferable to mix them with due consideration given to solubility of each of them. For example, it is preferable to assort them in a way the resulting mixture has a difference of solubility parameter by 4 or less (hereinafter referred to as "SP value" for short). When two liquids having a large difference between their SP values must be mixed, still another liquid having a mean SP value may be made to intervene as a mixing medium.

The mixing ratio of the above-mentioned surfactants is not particularly limited but it is preferable to mix 50 parts by weight or less, or more preferably, 20 parts by weight or less of them with 100 parts by weight of a base cleaning agent when the resulting mixture is intended for use as a degreasing cleaning agent. If the mixture should be used as a dewatering cleaning agent, preferably 20 parts or less, or more preferably, 3 parts by weight or less of a surfactant are mixed with 100 parts by weight of a base cleaning agent. On the other hand, the mixing ratio of hydrophilic solvents is not particularly limited as well, but it is preferable to mix 50000 parts by weight or less, more preferably 10000 parts by weight or less of them with 100 parts of a base cleaning agent, when the resulting mixture is intended for use as a degreasing cleaning agent. If as a dewatering cleaning agent, preferably 100 parts by weight or less, more preferably 50 parts by weight or less of a hydrophilic solvent are mixed with 100 parts by weight of a base cleaning agent.

In the cleaning method of the present invention, the above-mentioned cleaning stepes are over with the drying treatment thereafter. In this drying treatment, the sufficient drying effects can be obtained with a hot air of comparatively low temperature such as 60° C. or lower. Said drying by means of the hot air can be replaced by that of steam with a steaming cleaning agent such as isopropyl alcohol (hereinafter referred to a "IPA" for short). Drying by steam gives a better finishing touch and is well suited for fine cleaning. The present invention may be applied to metals, ceramics, plastics and the like; more specifically, metal parts, surface-treated parts, electronic and semiconductor parts, electric and precision machinery parts, optical parts, glass and ceramic parts and the like.

Incidentally, in the case where the cleaning method of the present invention is combined with steam cleaning (drying), the latter step can be carried out immediately after the cleaning stepes with above-mentioned dewatering or degreasing cleaning agents, dispensing with rinsing cleaning of the base cleaning agent. In other words, an entire cleaning method may be made complete by comprising the step of cleaning an object to be cleaned with a mixture of base cleaning agent and cleaning powder promoting agent and the step of steam drying the object after it goes through the earlier cleaning processes. Again, if combined with steam cleaning, all cleaning operations may as well be done with a base cleaning agent singly, depending upon stains to be eliminated. Mixtures of base cleaning agent with cleaning power promoting agent and how to use base cleaning agent have been discussed earlier.

The cleaning apparatus of the present invention will now be described in detail below:

The first cleaning apparatus of the present invention is characterized by comprising first means for cleaning, for example with a mixture of base cleaning agent of non-water system with cleaning power promoting agent and second means for cleaning with the base cleaning agent alone. The second means for cleaning is followed by means for drying such as hot air drying or steam drying. Further, still another means is prepared to separate and recover the base cleaning agent alone from the mixture of base cleaning agent and cleaning power promoting agent which is reclaimed from the above-mentioned first and second cleaning :means and therefore recovery and recycling of cleaning agents while two or more of them are permitted to circulate are feasible. The so recovered base cleaning agent is resupplied by recycling means to the first and second means for cleaning.

The second cleaning apparatus wherein waters and oil stains are cleaned off objects to be cleaned is characterized by comprising means for cleaning with a cleaning agent of non-water system having specific gravity smaller than that of waters but larger than that of oil stains as mentioned above, means for removing waters which are incorporated into the cleaning agent and precipitated and separated in the lowermost part thereof and means for removing oil stains which are incorporated into the cleaning agent and surfaced and separated at the uppermost part thereof. Non-water system cleaning agents to be used in these means have been described earlier and, because of the means for removing the precipitated waters and another means for removing the surfaced oil stains, waters and oil stains separated from the objects to be cleaned can be disposed of efficiently and each independently. Specific examples of these cleaning steps include immersion vessel, spray vessel and the like which may be operated in combination with ultrasonic wave, oscillation, mechanized stirring and the like.

DESCRIPTION OF THE PREFERRED EMBODIMENT(S)

Figure 1:
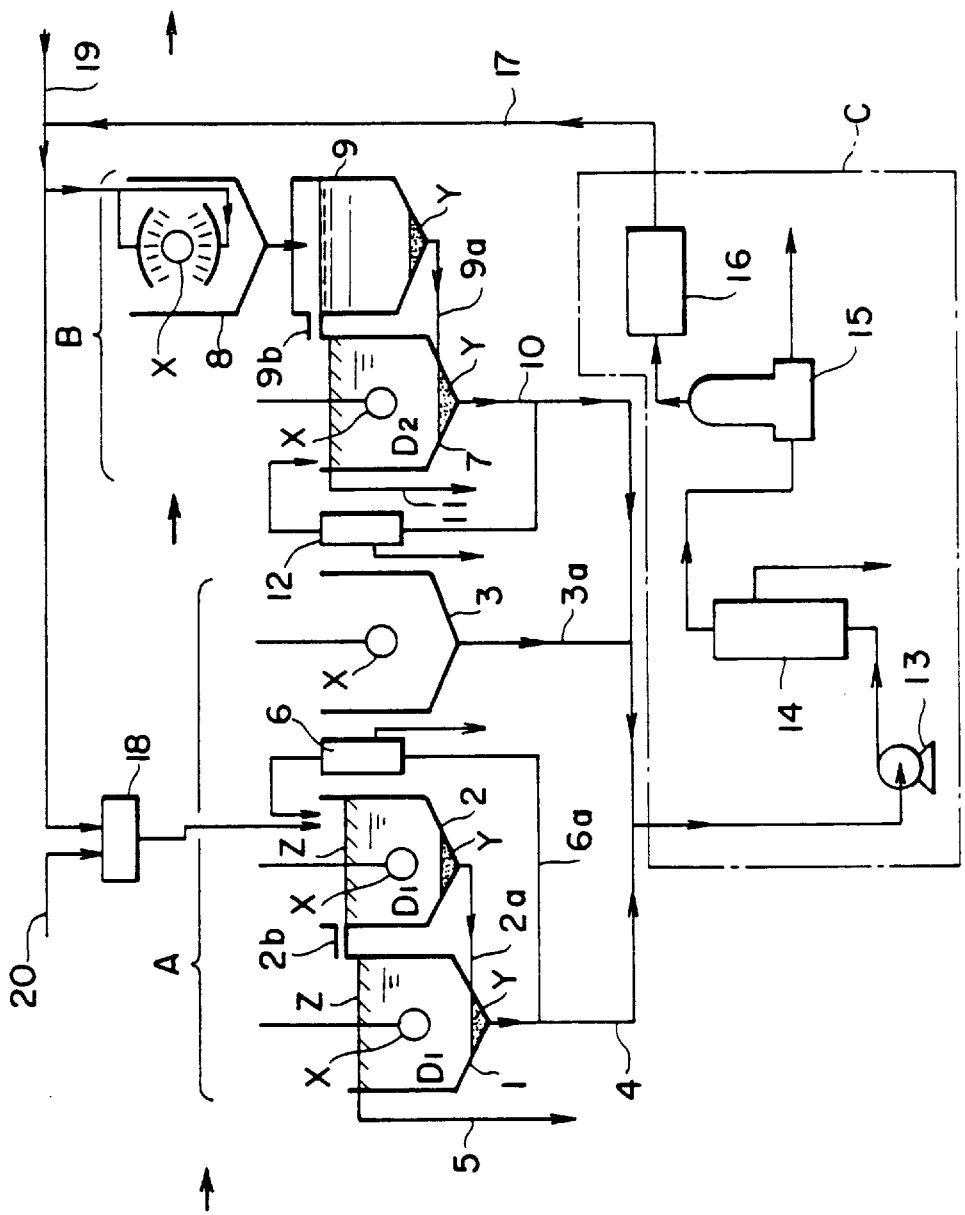
FIG. 1 is a diagram showing the construction of an cleaning apparatus used in an example of the present invention and, FIG. 2 is a diagram showing the construction of the other cleaning apparatus of the present invention.

The present invention will now be described with reference to the following examples:

FIG. 1 is a diagram showing the construction of the cleaning apparatus used in one example of the present invention. Briefly, the cleaning apparatus shown herein is comprised of a process A for cleaning and water substitution, a process B for rinsing and dewatering and a mechanism C for recycling of cleaning agents. There are a first cleaning vessel 1 and a second cleaning vessel 2 each having the capability to conduct two types of separation by precipitation and overflowing and a dewatering vessel 3 in the first process A for cleaning and water substitution.

In principle, the first vessel 1 and the second vessel 2 take care of two types of separation but either or both of them can be chosen, depending upon stains of the object to be cleaned. For example, even either separation by precipitation alone or separation by overflowing alone can function completely if so required by the object to be cleaned. Further, each of the cleaning vessels in the process A may be designed to consist of one single vessel or a set of two or more depending upon the required operating time and the quality standards to go by. The question of how many vessels there should be per set can find a solution in substantially the same way.

In this example, sets of 2 vessels each are used, and the first and second cleaning vessels 1 and 2 communicate with each other via the drain line 2a and the overflow line 2b. These cleaning vessels are operated in combination with ultrasonic wave, oscillation, mechanized stirring, heating of cleaning agent, brushing process and the like in order to increase the cleaning power, as need arises.

The above-mentioned first and second cleaning vessels 1 and 2 respectively contain a dewatering cleaning agent D1 which mixes a base cleaning agent such as silicon-containing cleaning agent, isoparaffin-containing cleaning agent or mixture thereof with a surfactant. The cleaning agent D1 containing the surfactant is pre-designed to have specific gravity which is smaller than that of water but larger than that of oil stain and thus the waters Y separated from the object to be cleaned are precipitated toward the lowermost part of the cleaning agent $D_1$ in the first and second cleaning vessels 1 and 2. Meanwhile, the oil stains Z likewise separated rise to the surface of the same cleaning agent $D_1$ of the same cleaning vessels 1 and 2 respectively.

The waters Y precipitated in the second cleaning vessel 2 are discharged to the side of the first cleaning vessel 1 via the drain line 2a at regular intervals. Again, the waters Y precipitated in the first cleaning vessel 1 are discharged at regular intervals into the cleaning agent recycling mechanism C which will be described later via the drain line 4. Meanwhile, the drain line 3a installed in the dewatering vessel 3 is connected to the cleaning agent recycling mechanism C. The oil stains Z surfaced in the first and second cleaning vessels 1 and 2 are allowed to overflow gradually and go out of the cleaning system via the overflow line 5 installed in the first cleaning vessel 1.

The dewatering cleaning agent $D_1$ in the first and second cleaning vessels 1 and 2 is extracted from the first cleaning vessel 1 by the circulation line 6a, the filter 6 removes solids, water particles and insoluble substances from the cleaning agent $D_1$ and then the cleaning agent $D_1$ returns to the second cleaning vessel 2. The cleaning agent $D_1$ is thus purified at all times by its circulation via the filter 6, keeping the cleaning vessel 2 replete of the pure cleaning agent $D_1$ though it is located at a downstream side of the cleaning process.

For example, humidity or water drops incorporated into the cleaning agent $D_1$ can be eliminated with ease by means of above-mentioned filter 6. Various types of filter can be chosen for the filter 6 depending upon stains to be eliminated and/or liquids to be dewatered, but preferably it is a microporous filter of ceramic, glass, high molecular weight organic substance or complex material thereof, having a pore diameter of 0.1 to 20 μm.

In the second process B for rinsing and dewatering, there are a third cleaning vessel 7 and a showering-rinsing vessel 8. Below the showering-rinsing vessel 8, there is a buffer tank 9 which is interlinked with the third cleaning vessel 7 via the drain line 9a and the overflow line 9b. This third cleaning vessel 7 is operated in combination with ultrasonic wave, oscillation, mechanized stirring, heating of cleaning agent, brushing process and the like as well, if need be.

The abovementioned third cleaning vessel 7 contains the cleaning agent $D_2$ compromising the base cleaning agent only which is same as used in above-mentioned first process A. Specific examples mentioned of non-water system cleaning agent used in the above-mentioned first process A are applied to the base cleaning agent used here. This cleaning agent $D_2$ is designed to have specific gravity smaller than that of water but larger than that of oil stains. Thus, as in cleaning vessels in the first process A, the waters Y are precipitated and separated in the lowermost part of the cleaning agent $D_2$, while the oil stains Z are surfaced and separated in the uppermost part thereof. The waters Y precipitated in the third cleaning vessel 7 are discharged to the cleaning agent recycling mechanism C via the drain line 10 at regular intervals, while the oil stains Z surfaced in third cleaning vessel 7 are brought outside the cleaning system through the overflow line 11.

Further, the cleaning agent $D_2$ in third cleaning vessel 7 always circulates via the filter 12, so that solids, water particles and insoluble substances are eliminated from the cleaning agent $D_2$ by the filter 12.

The recovery and recycling of cleaning agents in the cleaning system will now described below:

As mentioned earlier, the drain lines 4, 3a and 10 laid in the first, second and third cleaning vessels 1, 2 and 7 and the dewatering vessel 3 are interlinked with the cleaning agent recycling mechanism C respectively. The cleaning agent $D_1$ and $D_2$ in each vessel respectively is kept purified at all times by the filters 6 and 12 and when it is heavily soiled, the cleaning agent is subjected to fractional distillation in the cleaning agent recycling mechanism C after it is sent there by the water pump 13 through the drain lines 4 and 10. The cleaning agent $D_1$ collected in the dewatering vessel 3 is also sent to the cleaning agent recycling mechanism C at regular intervals.

Brought into the cleaning agent recycling mechanism C, the soiled cleaning agent is fed to the filter 14 first to separate solids from liquid, the solids are disposed of and the liquids alone are sent to the distiller 15. The distiller 15 separates each ingredient of the cleaning agent, the waters and the oil stains using the difference of their boiling point. The waters and the like left at distiller 15 are sent to the decanter 16 for further separation. The waters and the like may be separated and removed by a coalescer as preparatory step before they are sent to the distiller 15.

As used in the above-mentioned cleaning system, the dewatering cleaning agent $D_1$ is a mixture of the cleaning agent $D_2$ which is the base cleaning agent by itself with a surfactant and a repurified base cleaning agent or a repurified cleaning agent $D_2$ can be obtained by the extraction of both soiled cleaning agents $D_1$ and $D_2$. Except for the so repurified cleaning agent $D_2$, all extracted ingredients such as surfactant and water are discarded. The repurified cleaning agent $D_2$ is forwarded through the line 17 into the showering-rinsing vessel 8, the third cleaning vessel 7 or the mixer 18 which is the supplier of the cleaning agent $D_1$ to the second cleaning vessel 2.

In the showering-rinsing vessel 8, showering cleaning is conducted only with the impurity-free cleaning agent $D_2$, with the supply of above-mentioned repurified cleaning agent $D_2$ or a completely new cleaning agent $D_2$ sent from the cleaning agent supply line 19. In the mixer 18, the repurified or a brand new cleaning agent $D_2$ is mixed with a new surfactant supplied from the surfactant supply line 20 or an cleaning agent previously combined with a high concentration of surfactant to produce a new batch of cleaning agent $D_1$. The so produced cleaning agent $D_1$ is supplied to the second cleaning vessel 2 as need arises.

An example of the cleaning procedures will now be described below with respect to the cleaning system constructed as mentioned above:

When the object X to be cleaned is found carrying with it the waters Y and the oil stains Z, it is immersed at first in the order of the first and second cleaning vessels 1 and 2 of the first process A in order to remove the oil stains Z and substitute the waters Y with the dewatering cleaning agent. Then, the cleaning agent $D_1$ is removed from the surface of the object X over the dewatering vessel 13.

The object X then is brought into the second process B, goes through the third cleaning vessel 7 where it gets rid of the surfactant remaining on its surface and simultaneously is dewatered, arriving at the showering-rinsing vessel 8 in order to finalize its surface purification and dewatering by undergoing showering and rinsing with the impurity-free cleaning agent $D_2$ alone.

This is followed by the drying treatment by a hot air dryer which is not illustrated herein to complete all of the cleaning processes. Incidentally, the hot air drying may be replaced by steam drying (cleaning) with IPA and the like.

Now, the present inventors took note of the fact that steam cleaning can achieve excellent effects in this system if due consideration is given to the following points: namely, (1) the compatibility of a steam cleaning agent with a liquid carried forward from the earlier process, (2) evaporation latent heat of the steam cleaning agent and the difference of the evaporation latent heal between the steam cleaning agent and the liquid carried forward from the earlier process and (3) the boiling point.

With reference to the point (1), they had the finding that a steam cleaning agent can be a particularly effective factor if its SP value has a difference of 4 or less with that of the liquid carried forward from the earlier process, except for some instances where hydrogen bond of molecules and interaction of polar groups must be given further consideration. Steam cleaning is to condense the steam cleaning agent to form dews on the surface of the object to be cleaned so that these dews dissolve and wash away the liquids attached to the object. If there is a SP value difference of more than 4 between the steam cleaning agent and the liquid carried forward from the earlier process, sufficient substitutability is not obtained. Preferably the difference of SP value is 3 or less and more preferably 2 or less. With reference to the point (2), it is preferable to put to use a steam cleaning agent having an evaporation latent heat which is differed from that of the liquid carried forward from the earlier process by 5 folds or less. When the difference of evaporation latent heat is larger than 5 folds, one evaporates much faster than another, leaving the liquid having a larger evaporation latent heat behind on the object to be cleaned and keeping it remain as a blotch and the like there. Preferably the difference of evaporation latent heat is 3 folds or less and more preferably 2 folds or less. Further, preferably a steam cleaning agent has as small an evaporation latent heat as possible even when the above-mentioned difference is satisfied. Preferably, the value of evaporation latent heat is 200 cal/g or less, more preferably 100 cal/g or less and most preferably 50 cal/g or less. It is especially important to satisfy the abovementioned points (1) and (2) with respect to the system of the present invention.

Moreover, with respect to the point (3) above, the boiling point of a steam cleaning agent must be higher than the surface temperature of the object to be cleaned when it is subjected to steam cleaning. Preferably, the boiling point is higher than the surface temperature of the object by 20° C. or more, more preferably by 30° C. or more and most preferably by 50° C. or more; provided, however, that the difference between the boiling point and the surface temperature of the object to be cleaned can be regulated by manipulating the surface temperature of the object and thus that the desired difference can also be obtained by lowering the surface temperature of the object prior to the steam cleaning treatment. Still better results can be obtained, if satisfying the point (3) as well.

Meanwhile, silicon-containing cleaning agents and isoparaffin-containing cleaning agents are used in the process for rinsing cleaning of the present invention. Silicon-containing cleaning agents have the SP value of approximately 7 and evaporation latent heat of almost 35 cal/g, while isoparaffin-containing cleaning agents have the SP value of approximately 6 to 8 and the evaporation latent heat of almost 50 to 90 cal/g. Compared with these agents, the above-mentioned IPA (SP value=11, evaporation latent heat=161 cal/g and boiling point=82° C.) is found satisfying all of the points (1) to (3) and evidently well suited as a steam cleaning agent after the cleaning process of the present invention.

Fundamentally, steam cleaning agents to be used in the present invention preferably satisfy the abovementioned points (1) and (2) and more preferably the point (3) as well. Even whatever substances other than IPA as described above may be used as a steam cleaning agent of the present invention, if they satisfy all of these 3 conditions. For example, a perfluoro compound represented by the general formula: $C_nF_{2n+2}$ (wherein n is an integer of from 4 to 12); and a perfluoro compound represented by the structural formula:

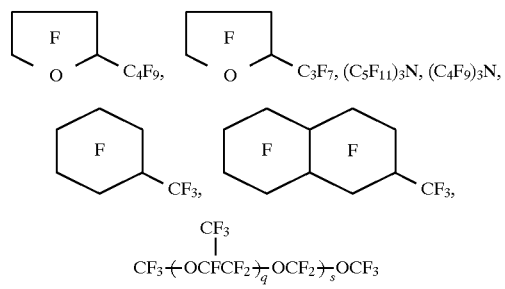

(wherein q and s are any integers) can be used therefor. These perfluoro compounds have the SP value of 5 to 6, the evaporation latent heat of almost 20 cal/g and the boiling point ranging from 50° C. to 200° C., satisfying all of the above-mentioned conditions (1) to (3). A perfluoro compound having the boiling point of 50° C. to 150° C. is preferable for practical use in cleaning. Further, perfluoro compounds do not exhibit compatibility with almost all organic solvents and have not found their place as a steam cleaning agent in the past except for in the case with the removal of particles. In the present invention, silicon-containing cleaning agents and isoparaffin-containing cleaning agents are used to rinse, and the perfluoro compounds have the compatibility with them (the SP value difference of 4 or less), capable of serving as a steam cleaning agent herein.

Steam cleaning agents such as IPA and perfluoro compound are not necessarily used singly but, for example their mixture is acceptable as well as their composition with the addition of silicon-containing cleaning agent, isoparaffin-containing cleaning agent or other organic solvents such as acetone. Further, flon or chlorine-containing solvents are not necessarily ineligible as the organic solvent for use in a mixture with IPA or perfluoro compound. It is desirable to stay away from their use from the viewpoint of environmental contamination but it does not seem entirely unlikely that even flons or chlorines can find their usefulness at any time while they are subject to halfway step by step restraints but are far away from the total ban. When a mixture is used as a steam cleaning agent, it is preferable that each component of the mixture should have the SP value and the evaporation latent heat satisfying the abovementioned conditions (1) and (2). The values of each such component should meet those mentioned as the example above. It also is acceptable that an organic solvent having a mean value for SP and evaporation latent heat is interposed as a mixing medium.

Meanwhile, a very useful, one liquid for all type composition, a liquid which is good all the way from degreasing cleaning to drying, can be obtained by mixing abovementioned perfluoro compounds with silicon-containing cleaning agents and/or isoparaffin-containing cleaning agents and also organic solvents such as IPA, ethanol, methanol acetone and dioxane. For the purpose of such one liquid for all type composition, it is preferable to mix 0.01 to 1000 parts by weight of silicon-containing cleaning agents and/or isoparaffin-containing cleaning agents and 0.01 to 1000 parts by weight of other organic solvents with 100 parts by weight of an abovementioned perfluoro compound. The more preferable range of the mixing ratio with the perfluoro is 0.1 to 100 parts by weight of other components. This one liquid for all type composition exhibits the properties of degreasing, dewatering and steam cleaning without the need for work-oriented changes of the composition and is good for all including operations from degreasing cleaning to drying.

So far, the above cleaning system has been described with chief emphasis placed on dewatering cleaning but it can also be applied to degreasing cleaning if using the different kind of cleaning agents.

In the abovementioned cleaning system, drying is completed with blowing of a hot air at approximately 50 to 60° C. for approximately 5 minutes. Under the conventional methods wherein washing with hot water is followed by hot air drying, the drying time is almost as long as 15 minutes even at the temperature as high as 120° C. to 150° C. On the other hand, in the present invention, the object to be cleaned is not exposed to a high temperature and can be forwarded to a next process as it is after hot air drying, does not require the space and time for cooling and contributes to the improvement of productivity to a great extend. Not only the time required for drying is made shorter, but also since dewatering operation is conducted for every batch of the objects to be cleaned, the finished products are free of irregularities in dewatering and have the much improved quality, as far as the batch they belong to is concerned. There also is no possibility of faulty finished products with cracks which are attributable to irregularities in cleaning and the level of product quality can be brought up very high.

In the cleaning system constructed as abovementioned, the cleaning agents have specific gravity smaller than that of waters but lager than that of oil stains, so a layer of cleaning agent intervenes between those of waters and oil stains, separating waters from oils completely and enabling the cleaning system to discard them efficiently and each independently. Their separation complete, waters and oils are respectively disposed of by means of cleaning agents, but it is likely that a trace amount of cleaning agents are incorporated into the discarded waters and oils. The cleaning agents incorporated into oils are consumed when the waste oils are incinerated. There is no problem in connection with cleaning agents incorporated into waters as well, because they are separated from waters with ease by means of filter or distiller.

With the cleaning system of such construction as described above, not only the cleaning agents can be used efficiently and effectively, but also the use of two or more cleaning agents in combination is made possible. The amount of use of cleaning agents is reduced to a large extent as two or more of them are put to use simultaneously, contributing much to a sharp cut of operating costs. The cleaning apparatus of the present invention may be allowed to operate as preparatory step for steam drying with IPA, preventing waters from being mixed with repurified IPA. Because of a large difference of boiling points existent between IPA and the above-mentioned dewatering cleaning agent as used in the present invention, it is made possible to implement steam drying with IPA alone. Incidentally, waste waters once mixed with IPA have been regarded as hard to remove because their boiling point is close to that of IPA, and they are often blamed for watermarks.

Figure 2:
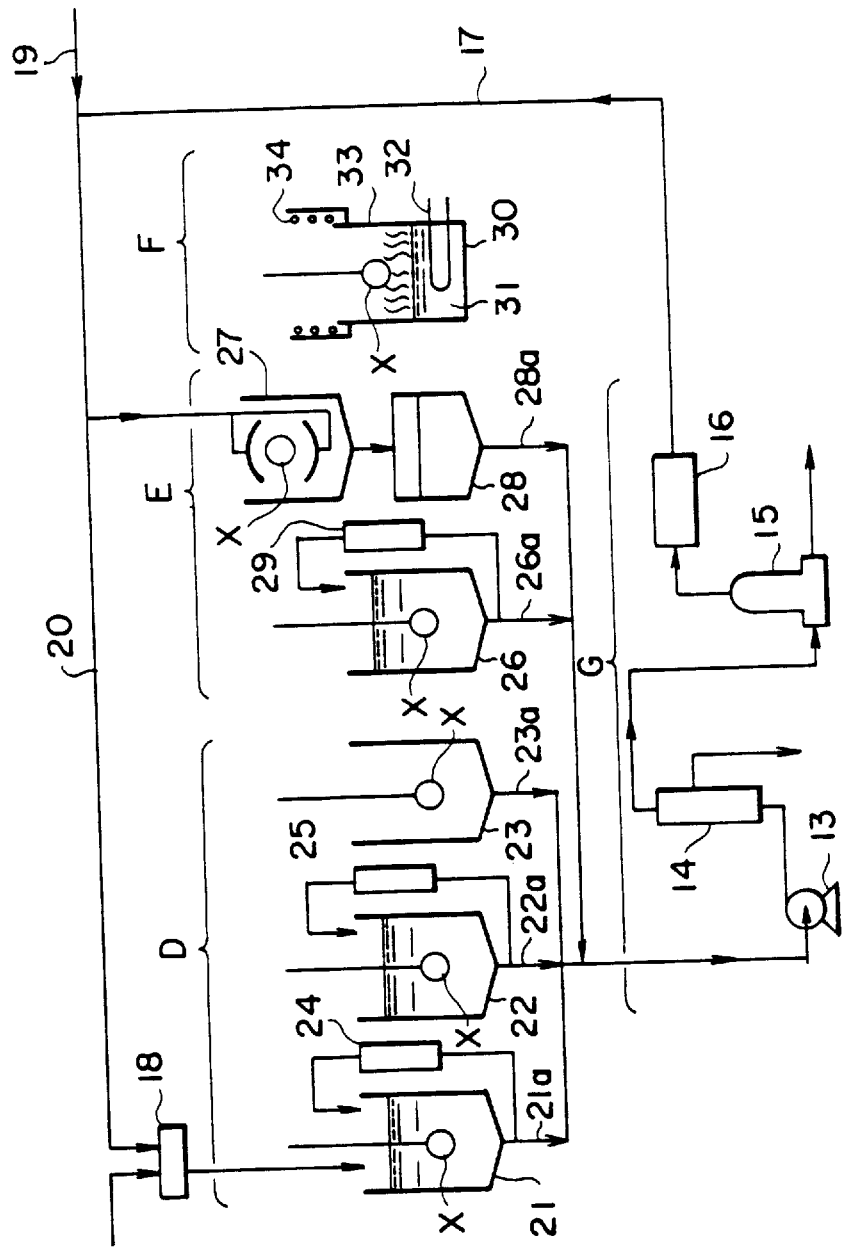

The present invention will now be described with reference to the other example. FIG. 2 is a diagram showing the construction of a cleaning apparatus used in the other example. Generally speaking, the cleaning apparatus as shown in the diagram is comprised of a cleaning process D, a rinsing process E, a drying process F and a cleaning agent recycling mechanism G. There are a first cleaning vessel 21, a second cleaning vessel 22 and a dewatering vessel 23 in the first cleaning process D. Each cleaning vessel in the cleaning process D may be pre-designed to consist of one single vessel or a set of two or more, depending upon the required operating time and the quality standard to go by and the question how many vessels there should be per set finds a solution in substantially the same way. The first and second cleaning vessels 21 and 22 are operated in combination with ultrasonic wave, oscillation, mechanized stirring, heating of cleaning agent, brushing process and the like in order to promote the cleaning power, if need be.

The above-mentioned first and second cleaning vessels 21 and 22 respectively contain the degreasing cleaning agent $D_3$ which comprises a base cleaning agent such as silicon-containing cleaning agent, isoparaffin-containing cleaning agent or mixture thereof and a hydrophilic solvent. The cleaning agent $D_3$ containing the hydrophilic solvent dissolves the oil stains of the object to be cleaned with the cleaning power provided by the hydrophilic solvent. In the case where stains attached to the object to be cleaned are not completely dissolved and removed in the first cleaning vessel 21 alone, they may be taken over by the second cleaning vessel 22 continuingly.

The cleaning agent $D_3$, either contained respectively in the first and second cleaning vessels 21 and 22 or brought into the dewatering vessel 23, are forwarded to the cleaning agent recycling mechanism C via the drain lines 21a, 22a and 23a. The filters 24 and 25 are respectively connected to the first and second cleaning vessels 21 and 22, removing solids and insoluble substances from the cleaning agent $D_3$ and then returning it to each cleaning vessel. Various types of filter may be chosen for the filters 24 and 25, depending upon what stains to be cleaned up, but preferably they are a microporous filter having a pore size of 0.1 to 20 $\mu$m, made of ceramic, glass, high molecule organic material or complex material thereof.

In the second rinsing process E, there are a third cleaning vessel 26 and a showering-rinsing vessel 27. The third cleaning vessel 26 contains the cleaning agent $D_4$ comprising only the same base cleaning agent as it is used in the first process D described above. Below the showering-rinsing vessel 27, there is a buffer tank 28, while this butter tank 28 and the third cleaning vessel 26 are respectively interlinked to the cleaning agent recycling mechanism C via drain lines 28a and 26a. This third cleaning vessel 26 also is operated in combination with ultrasonic wave, oscillation, mechanized stirring, heating of cleaning agent, brushing process and the like if need be. The cleaning agent $D_4$ contained in the third cleaning vessel 26 always continue circulating through the filter 29 which removes solids, insoluble substances and the like from the cleaning agent $D_4$.

In the third drying process F, there is a steam cleaning (drying) vessel 30. This steam cleaning vessel 30 contains the steam cleaning agent 31 which is a liquid of, for example IPA, perfluoro compound or mixture thereof as above described and the steam cleaning agent 31 is heated by the heater 32, transforming into the steam 33. Inside the steam cleaning vessel 30, the steam 33 is condensed to form dews on the surface of the object X to be cleaned and the cleaning agent $D_4$ carried forward from the rinsing process E is dissolved into the so liquidized steam cleaning agent 31 and washed away. The object X to be cleaned is detained as long as necessary in the vicinity of the cooling chiller 34 located at the uppermost part to evaporate the steam cleaning agent 31 remaining on its surface and thus complete the drying of the object X.

The cleaning agents in this cleaning system are recovered and recycled in substantially the same mechanism as in the example described earlier.

The cleaning by the use of above-mentioned cleaning system and the result of its evaluation will now be described with reference to the specific examples:

EXAMPLES 1 TO 8

The examples of degreasing cleaning will be described first. A mixture of 50 parts by weight of octamethylcyclotetrasiloxane (SP value=7) and 50 parts by weight of diethylene glycol monobutylether (SP value=8) and a mixture of 50 parts by weight of volatile isoparaffin (SP value=7) and 50 parts by weight of diethylene glycol monobutylether were prepared as the cleaning agent in the first cleaning process. An octamethylcyclotetrasiloxane was used as the rinsing cleaning agent in the second cleaning process. The various compounds listed in Table 1 were used as the steam cleaning agent. The following charts shows the SP value, the evaporation latent heat and the boiling point of the steam cleaning agents listed in Table 1. The steam cleaning agents used in these examples were selected with the SP value and the evaporation latent heat of octamethylcyclotetrasiloxane as standard reference.

(The rest of the space left in blank)

|  | SP Value | Evaporation Latent Heat (cal/g) | Boiling Point (°C.) |
|---|---|---|---|
| $C_8F_{18}$ | 5 | 20 | 97 |
| 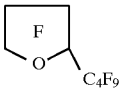 | 6 | 20 | 102 |
| IPA | 11 | 161 | 82 |
| Octamethylcyclotetrasiloxane | 7 | 36 | 175 |
| Hexamethyldisiloxane | 7 | 51 | 100 |
| Acetone | 10 | 62 | 56 |
| Ethanol | 13 | 204 | 78 |

Printed boards using the Sparkle Flux PO-F-4600, a brand of rosin-containing flux (supplied by Senju Metal Industries Co., Ltd.: for chip-mounted board, SP value=approximately 10) were cleaned with these cleaning agents. The ultrasonic wave cleaning was implemented at 45° C. for 3 minutes and then the rinsing cleaning for 2 minutes in the first cleaning process. The so cleaned printed boards were subjected to steam drying with each of the steam cleaning agents and the time span required for drying was measured. Likewise, hot air drying at 50° C. was conducted and the time span required for this type of drying was measured. Further, after drying, the ion residue ($\mu$g NaCl/inch$^2$) on the surface of the printed boards was measured by an omegameter (Nippon Alpha Metals Co., Ltd.) in accordance with the procedures provided for in MIL-P-55110C and MIL-P-28809A. Further, the flux residue was measured with the naked eye and microscopically, making an examination for the presence of stains having the major axis of 0.05 mm or more. The practical usefulness was analyzed according to global judgment, marking excellent as ⊚, good as o, fairly good as Δ and poor as x and the results are shown in Table 1.

TABLE 1

|  | Cleaning composition (Parts by weight) | Rinsing composition (parts by wieght) | Steam cleaning composition (Parts by weight) | | | | | Results of cleaning | | | |
|---|---|---|---|---|---|---|---|---|---|---|---|
|  |  |  | IPA | Other organic solvents | Octamethylcyclotetrasiloxane | Hexamethyldisiloxane | Perfluoro compounds | Drying time/ (second) | Ion reside ($\mu$g NaCl/ In2) | Appearance (white reside) | Usefulness (Global judgement) |
| Example 1 | Octamethylcyclotetrasiloxane 50 | Octamethylcyclotetrasiloxane 100 | 100 | — | — | — | — | 45 | 7 | None | ⊚ |
| Example 2 | Diethylene glycol monobutylether 50 |  | 0.5 | — | 1.5 | — | 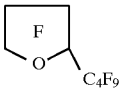 98 | 19 | 6 | None | ⊚ |
| Example 3 | Volatile isoparaffin 50 |  | — | Acetone 1 | — | 20 | $C_8F_{18}$ 79 | 18 | 5 | None | ⊚ |
| Example 4 | Diethylene glycol monobutylether 50 |  | — | Acetone 3 | — | 30 | 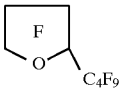 67 | 17 | 8 | None | ⊚ |
| Exam- |  |  | — | — | — | — | $C_8F_{18}$ | 20 | 5 | None | ⊚ |

TABLE 1-continued

| | Cleaning composition (Parts by weight) | Rinsing composition (parts by wieght) | Steam cleaning composition (Parts by weight) | | | | | Results of cleaning | | | |
|---|---|---|---|---|---|---|---|---|---|---|---|
| | | | IPA | Other organic solvents | Octa-methyl-cyclotetra-siloxane | Hexa-methyl-disiloxane | Perfluoro compounds | Drying time/ (second) | Ion reside (μg NaCl/ In2) | Appearance (white reside) | Usefulness (Global judgement) |
| ple 5 | | | | | | | 100 | | | | |
| Example 6 | Octamethylcyclo-tetrasiloxane 50 | | — | — | — | — | 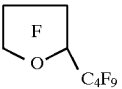 100 | 19 | 4 | None | ⊚ |
| Example 7 | Diethylene glycol monobutylether 50 | | — | — | — | — | — | 35 | 8 | None | ⊚ |
| Example 8 | | | (Dried by 50° C. warm wind) | | | | | 125 | 6 | None | ○ |
| Comparative example 1 | Octamethylcyclo-tetrasiloxane 50 Diethylene glycol monobutylether 50 | IPA 100 | — | — | — | — | 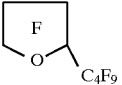 100 | 58 | 18 | A lot of dry blots | X |
| Comparative example 2 | Ethanol 100 | 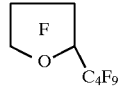 100 | — | — | — | — | 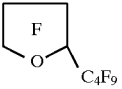 100 | 20 | 45 | Present | X |

As evident from Table 1, the sufficient degreasing cleaning power was obtained and steam cleaning (drying) also resulted in a very good outcome in Examples 1 to 8. This is accounted for by the prearranged difference of SP value by 4 to 2 between the rinsing and steam cleaning agents. On the other hand, the agent having the SP value difference of 5 or more in each of the Comparative Examples apparently failed to provide the sufficient cleaning powder.

EXAMPLES 9 TO 12

Next, the examples of dewatering cleaning will be described. A mixture of 99.5 parts by weight of octamethylcyclotetrasiloxane and 0.5 part by weight of polyoxyethylene oleyl ether (SP value=8) and a mixture of 99.0 parts by weight of volatile isoparaffin (SP value=7) and 1.0 part by weight of sodium stearate were prepared as the dewatering cleaning agent. Further, various compounds listed in Table 2 were used as the steam cleaning agent.

Miniature ball bearings made of stainless steel were subjected to dewatering cleaning with these agents. 2 pieces of miniature ball bearings were immersed in water, then immersed in a dewatering cleaning agent at ordinary temperature for one minute (with oscillation) and subjected to steam drying. Thereafter, the ball bearings were placed in the predetermined amount of anhydrous ethanol, the remaining waters were absorbed thereto and the quantitative analysis with the waters was conducted according to the Karl Fischer method. The rate of water removal was calculated according to the following formula:

The rate of water removal=(B−A)/B×100

(wherein A is the value (g) of the quantitative analysis according to the Karl Fischer method and B is the value (g) of the quantitative analysis after the blank test (excluding the process in which the testing sample was thrown into water)).

Further, the post-drying appearance was evaluated according to the following standard:

x : dried blobs visible with the naked eye. ○: dried blobs invisible with the naked eye. ⊚: blob having the size of 50μm or greater not observed by scanning electron microscope.

These results are shown in Table 2.

TABLE 2

| | Dewatering composition (Parts by weight) | Steam cleaning composition (Parts by weight) | | | | | Results of cleaning | | |
|---|---|---|---|---|---|---|---|---|---|
| | | IPA | Other organic solvents | Octamethyl-cyclo tetra-siloxane | Hexamethyl disloxane | Perfluoro compounds | Appearance after cleaning | Rate of water % removal | Usefulness (*) |
| Example 9 | Octamethylcyclo tetrasiloxanei 99.5 | — | — | — | — | — | ⊚ | 99.3 | ⊚ |
| Example 10 | Diethylene glycol monobutylether 0.5 | 0.5 | — | 2.0 | — | $C_8F_{18}$ 97.5 | ⊚ | 99.3 | ⊚ |

TABLE 2-continued

| Dewatering composition (Parts by weight) | | Steam cleaning composition (Parts by weight) | | | | | Results of cleaning | | |
|---|---|---|---|---|---|---|---|---|---|
| | | IPA | Other organic solvents | Octamethyl-cyclo tetra-siloxane | Hexamethyl disloxane | Perfluoro compounds | Appearance after cleaning | Rate of water % removal | Usefulness (*) |
| Example 11 | Volatile isoparaffin 99.0 | — | Acetone 0.5 | 2.0 | — | [F-O-C$_4$F$_9$ ring] 97.5 | ⊙ | 99.1 | ⊙ |
| Example 12 | Sodium stearate 1.0 | — | — | — | — | C$_8$F$_{18}$ 100 | ⊙ | 99.5 | ⊙ |
| Comparative Example 3 | Flon 113/ surfactant system 100 | — | — | Flon 113/ surfactant system 100 | — | — | ⊙ | 99.1 | ⊙ |

*(Global judgement)

As evident from Table 2, the sufficient dewatering effect was obtained in each of the Examples without the specific need for rinsing cleaning.

EXAMPLES 13 TO 15

Next, the finishing cleaning (removal of particles) will be described. An octamethylcyclotetrasiloxane and a volatile isoparaffin were used as the finishing cleaning agent. Further, various compounds listed in Table 3 were used as the steam cleaning agent.

The cover glass for charge coupled device was subjected to finishing cleaning with these agents. The cover glass for CCD was cleaned with the finishing cleaning agent at 45° C. in combination with the ultrasonic wave and then subjected to steam cleaning for the sake of finishing drying. After drying, the appearance was analyzed and the amount of dusts on the surface measured. The after drying appearance was analyzed in substantially the same way as in Example 9 above. The amount of surface dusts(0.5 μm or more) was measured by a particle checker WM-1000 (Tokyo Optical Co., Ltd.) according to the laser method.

These results are shown in Table 3.

TABLE 3

| | Cleaning composition | Steam cleaning composition (Parts by weight) | | | | | Results of cleaning | | |
|---|---|---|---|---|---|---|---|---|---|
| | | IPA | Other organic solvents | Octamethyl-cyclotetra-siloxane | Decamethyl-cycloki-siloxane | Perfluoro compounds | Appearance after cleaning | Amount of remaining dusts*1 | Usefulness*2 |
| Example 13 | Octamethyl-cyclo tetra-siloxane 100 | 100 | — | — | — | — | ⊙ | 15 | ⊙ |
| Example 14 | | — | Acetone 0.1 | 3 | — | *3 96.9 | | 12 | ⊙ |
| Example 15 | Volatile isoparaffin 100 | — | — | — | — | [F-O-C$_4$F$_9$ ring] 100 | ⊙ | 13 | ⊙ |
| Comparative Example 4 | Flon 113 100 | — | Flon 113 100 | — | — | 100 | ⊙ | 20 | ⊙ |
| Comparative Example 5 | [F-O-C$_4$F$_9$ ring] 100 | — | — | — | — | [F-O-C$_4$F$_9$ ring] 100 | Δ A part of grinding C$_4$F$_9$ materials remained | 150 | ⊙ |

*1 (/0.5 in2)
*2 (Global judgement)
*3 $CF_3\text{-}(OCFCF_2)_m\text{-}(OCF_2)_n\text{-}OCF_3$
         $|$
         $CF_3$ As evident from Table 3, the sufficient particle control was found achieved in each of the Examples.

EXAMPLES 16 TO 19

As shown in Table 4, the certain degreasing cleaning agents were prepared by mixing a volatile isoparaffin with various organic solvents. Further, a volatile isoparaffin was used as the rinsing cleaning agent.

Printed boards with flux were cleaned with these agents in accordance with substantially the same procedures as in Example 1 and the result of subsequent hot air drying at 50° C. was analyzed in substantially the same way as in Example 1. Further, a testing sample was prepared by applying a spindle oil to a steel plate and baking the plate in a furnace at 150° C. for 48 hours. The oil baked on this testing sample was subjected to cleaning (ultrasonic wave cleaning) and the time span required for such cleaning was measured. The smaller the value is, the higher the cleaning power is and these results are shown in Table 4.

EXAMPLE 20

In accordance with substantially the same procedures as in Example 13, the cover glass for CCD was subjected to finishing cleaning with volatile isoparaffin used as the finishing cleaning agent and the cleaning and drying properties were evaluated in substantially the same way as in Example 13. Drying was conducted with a hot air at 50° C. The results are shown in Table 5.

TABLE 5

| | Solvents used in the waste-removal process | Appearance after cleaning | Amount of remaining dusts (/0.5 in²) |
|---|---|---|---|
| Example 20 | Volatile inparaffin | ⊚ | 100 |
| Comparative example 11 | Kerosine | Slow drying, incidence of | 720 |

TABLE 4

| | Organic solvents | Volatile isopa-raffin | Kerosine | Other hydro-carbons | Flon 113/ ehtanol azeotrope system | Drying time (second) | Ion residue (μg NaCl/in2) | Appearance (White residue) | Oil cleaning time (second) |
|---|---|---|---|---|---|---|---|---|---|
| Example 16 | Ethyl alcohol 2 | 98 | — | — | — | 40 | 11 | ⊚ | 92 |
| Example 17 | Diethylene glycol mono-butylether 50 | 50 | — | — | — | 180 | 9 | ⊚ | 60 |
| Example 18 | d-Limonene 30 Ethyl alcohol 10 | 60 | — | — | — | 120 | 7 | ⊚ | 45 |
| Example 19 | α-Pinene 30 IPA 10 | 60 | — | — | — | 130 | 5 | ⊚ | 40 |
| Comparative example 6 | — | — | 100 | — | — | 820 | 40 | X | 150 |
| Comparative example 7 | — | — | — | Isopropyl benzene 100 | — | >2,000 | 42 | X | 166 |
| Comparative example 8 | Ethyl alcohol 2 | — | — | Deamyl-benzene 98 | — | >2,000 | 14 | ○ | 135 |
| Comparative example 9 | Diethylene glycol monobutyl-ether 30 | — | — | n-Decane 70 | — | 630 | 15 | X | 162 |
| Comparative example 10 | — | — | — | — | 100 | 20 | 11 | ⊚ | 60 |

As evident from Table 4, hot air drying could be brought to completion within a short span of time in the case of cleaning with an agent containing the isoparaffin as the chief ingredient, followed by rinsing with the volatile isoparaffin (Examples 16 to 19). The ion residue was low as well, nor was the white residue observed. Further, these agents were fast at the speed of degreasing cleaning, exhibiting the cleaning power equal to or better than that of a flon 113/ethane azeotrope system. On the other hand, when cleaning and rinsing were conducted with alkylbenzene such as isopropylbenzene and diamylbenzene and straight chain paraffin such as n-decane and kerosene, drying by hot air resulted in a poor outcome and could not be completed even in 30 minutes. Thus, there were a lot of ion residues and too much flux components (white residue) to be swept away.

TABLE 5-continued

| | Solvents used in the waste-removal process | Appearance after cleaning | Amount of remaining dusts (/0.5 in²) |
|---|---|---|---|
| | | dry blots X | |
| Comparative example 12 | Isopropylbenzene | Drying incomplete even in 30 minutes X | 2,000 |
| Comparative example 13 | Diamylbenzene | X | 2,600 |
| Comparative example 14 | n-Decane | ○ | 350 |

TABLE 5-continued

| | Solvents used in the waste-removal process | Appearance after cleaning | Amount of remaining dusts (/0.5 in$^2$) |
|---|---|---|---|
| Comparative example 15 | Flon 113/ethanol azeotrope system | ◉ | 90 |

As evident from Table 5, the volatile isoparaffin in terms of finishing cleaning achieved the sufficient cleaning power which is equal to or better than that of flon 113, without causing post-cleaning dried blobs or dusts. On the other hand, in each of the Comparative Examples, the agent had low dryness, with a high incidence of dried blobs, while a large amount of dusts were found attached to object to be cleaned during the drying process.

EXAMPLES 21 TO 24

The printed boards with flux on were cleaned by the degreasing, rinsing and steam cleaning agents listed in Table 6 in accordance with substantially the same procedures as in Example 1 and the cleaning and drying properties were evaluated in substantially the same way as in Example 1. The degreasing and rinsing cleaning were done at 45° C. for 5 minutes in combination with ultrasonic wave. The results are shown in Table 6.

As evident from Table 6, when the printed boards were cleaned with an agent containing isoparaffin as the chief ingredient and a steam cleaning agent, drying was found completed within 15 to 20 seconds, accompanied by few ion residue and no remaining flux (white residue). These agents were found as effective as or more effective than a flon 113/ethane azeotrope system.

EXAMPLES 25 TO 27

Using the dewatering and steam cleaning agents listed in Table 7, miniature ball bearings were subjected to dewatering cleaning according to substantially the same procedures as in Example 9 and the cleaning and drying properties were evaluated in substantially the same way as in Example 9. The dewatering cleaning was implemented with the ball bearings immersed in the agents while stirring at 45° C. for one minute. The results are shown in Table 7.

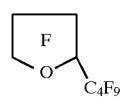

TABLE 6

| | Cleaning process (composition, parts by weight) | | | | | | | | Results of evaluation | | |
|---|---|---|---|---|---|---|---|---|---|---|---|
| | Volatile isoparaffin | Organic solvents | Kerosine | Isopropyl benzene | diamlybenzene | n-Decane | Fron 113/ ethanol azeotrope system | Rinsing process | Steam Drying process | Drying time (second) | Ion residue (μg NaCl/ in$^2$) | Appearance (white residue) |
| Example 21 | 98 | Ethanol 2 | — | — | — | — | — | Volatile isoparaffin | $C_8F_{18}$ | 20 | 9 | None |
| Example 22 | 96 | Ethanol 4 | — | — | — | — | — | ↑ | $C_6F_{14}$ | 15 | 6 | None |
| Example 23 | 70 | Diethylene glycol monobutylether 30 | — | — | — | — | — | ↑ | $N(C_4F_9)_3$ | 17 | 7 | None |
| Example 24 | 30 | Diethylene glycol monobutylether 70 | — | — | — | — | — | ↑ | (structure with F, O, $C_4F_9$) | 15 | 8 | None |
| Comparative example 16 | — | 50 | 50 | — | — | — | — | Kerosine | IPA | 60 | 21 | None |
| Comparative example 17 | — | 70 | — | 30 | — | — | — | Isopropyl bensene | IPA | 82 | 15 | Dry blobs present |
| Comparative example 18 | — | 20 | — | — | 80 | — | — | Diamylbenzene | IPA | 98 | 31 | Dry blobs present |
| Comparative example 19 | — | — | — | — | — | 100 | — | n-Decane | IPA | 45 | 38 | Dry blobs present |
| Comparative example 20 | — | — | — | — | — | — | 100 | ← | ← | 25 | 9 | None |

TABLE 7

| | Cleaning process (composition of cleaning agent, parts by weight) | | | | | | | | | Result of evaluation | |
|---|---|---|---|---|---|---|---|---|---|---|---|
| | Volatile isoparaffin | Polyoxy-ethylene oleylether | Polyoxy-ethylene butyl-phenyl ether | Kero-sine | Isopropyl benzene | Diamyl-benzene | n-Decane | Flon 113/ surfactant system | Steam cleaning process | Appear-ance | Ratio of water removal % |
| Example 25 | 99.5 | 0.5 | — | — | — | — | — | — | $C_6F_{14}$ | ⊙ | 99.3 |
| Example 26 | 99.5 | — | 0.5 | — | — | — | — | — | $C_8F_{18}$ | ⊙ | 99.4 |
| Example 27 | 99.0 | — | 1.0 | — | — | — | — | — | *3 | ⊙ | 99.6 |
| Comparative example 21 | — | — | — | 100 | — | — | — | — | $C_8F_{18}$ | Waters remaining X | 62 |
| Comparative example 22 | — | 0.5 | — | — | 99.5 | — | — | — | $C_6F_{14}$ | X | 91 |
| Comparative example 23 | — | 1.0 | — | — | — | 99.0 | — | — | 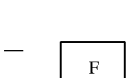 | X | 89 |
| Comparative example 24 | — | — | 0.5 | — | — | — | 99.5 | — | $C_8F_{18}$ | X | 96 |
| Comparative example 25 | — | — | — | — | — | — | — | 100 | ← | ⊙ | 99.2 |

*3 $CF_3\text{-}(OCFCF_2)_m(OCF_2)_n\text{-}OCF_3$
         |
         $CF_3$

EXAMPLES 28 TO 29

Using the finishing and steam cleaning agents listed in Table 8, the cover glass for CCD was subjected to cleaning in accordance with substantially the same procedures as in Example 13 and the cleaning and drying properties were evaluated in substantially the same way as in Example 13. The results are shown in Table 8.

=13) was prepared as the cleaning agent in the first cleaning process and the octamethylcyclotetrasiloxane was used as the rinsing cleaning agent in the second cleaning process. Further, a $C_8F_{18}$ was used as the steam cleaning agent. Using these agents, the cleaning and drying properties were evaluated in accordance with substantially the same procedures as in Example 1 and the results substantially as good as in Example 1 were obtained.

TABLE 8

| | Waste removal process | Steam cleaning process | Appearance | Amount of remaining dusts/in² |
|---|---|---|---|---|
| Example 28 | Volatile isoparaffin | F–O–$C_4F_9$ (ring) | ⊙ | 15 |
| Example 29 | Volatile isoparaffin | $CF_3\text{-}(OCFCF_2)_m(OCF_2)_n\text{-}OCF_3$ / $CF_3$ | ○ | 18 |
| Comparative example 26 | Kerosine | F $C_4F_9$ | ○ | 220 |
| Comparative example 27 | Isopropyl benzene | $CF_3\text{-}(OCFCF_2)_m(OCF_2)_n\text{-}OCF_3$ / $CF_3$ | ○ | 340 |
| Comparative example 28 | Diamylbenzene | $C_6F_{14}$ | ○ | 250 |
| Comparative example 29 | n-Decane | F–O–$C_3F_7$ (ring) | ○ | 180 |
| Comparative example 30 | Flon 113 (ethanol azeotrope system) | ← | ⊙ | 32 |

EXAMPLE 30

A mixture of 50 parts by weight of hexamethyldisiloxane (SP value=7) and 50 parts by weight of ethanol (SP value In this Example, there was the SP value difference of more than 5 between the cleaning agents or between hexamethyldisiloxane and ethanol but because of the interaction between the polar groups, both the compounds turned out compatible one another, resulting in the above-mentioned favorable outcome.

EXAMPLE 31

A one liquid for all type cleaning agent was prepared by mixing 100 parts by weight of $C_6F_{14}$ as a perfluoro compound, 25 parts by weight of hexamethyldisiloxane as a silicon-containing cleaning agent and 3 parts by weight of acetone as an organic solvent. Meanwhile, the testing sample was prepared by applying to a steel plate YF33, a brand of silicon-containing press oil (supplied by Thoshiba Silicon Co., Ltd.) and baking the plate at 100° C. The testing sample was cleaned using the above-mentioned one liquid for all type cleaning agent. Cleaning was conducted at 40° C. for 3 minutes in combination with ultrasonic wave, followed by steam cleaning with the same agent.

In the infrared absorbing analysis with the so cleaned steel plate, a peak ascribed to silicon was not observed, resulting in the finding of the non-presence of silicon residues.

INDUSTRIAL APPLICABILITY

The excellent properties of degreasing cleaning, water substituting and drying, comparable to those of conventional flon-containing cleaning agents, are obtained by the cleaning method of the present invention, unaccompanied by the possibility of environmental destruction and contamination and, therefore, the cleaning method is useful as a replacement of the other one by the use of highly controversial flon-containing solvents. Further, under the present invention, the cleaning agents are recycled while two or more of them circulate simultaneously and the waters and stains which are removed from objects to be cleaned are disposed of efficiently, both contributing much to the saving of materials relating to cleaning.

What is claimed is:

1. A method of cleaning an industrial part comprising the steps of:
   (a) a step of cleaning said industrial part with a non-water cleaning agent,
   wherein said cleaning agent comprises at least one non-water system agent selected from the group consisting of a silicon-containing cleaning agent and an aliphatic hydrocarbon cleaning agent having from 4 to 30 carbon atoms,
   wherein said silicon-containing cleaning agent comprises at least one low molecular weight polyorganosiloxane selected from the group consisting of a straight chain polyorganosiloxane represented by the formula:

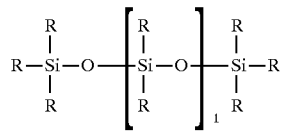

and a cyclic polyorganosiloxane represented by the formula:

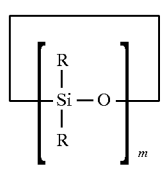

wherein R in each formula is a substituted or unsubstituted hydrocarbon group, 1 is an integer from 0 to 5, and m is an integer of from 3 to 7, and wherein said aliphatic hydrocarbon cleaning agent comprises at least one agent selected from the group consisting of a volatile isoparaffin having 4 to 30 carbon atoms, a volatile normal paraffin, and a volatile cyclo-olefin
   (b) a step of drying said industrial part by use of a vapor drying treatment after the step of cleaning,
   wherein said drying is conducted with a non-water vapor drying agent which is different from said cleaning agent, and wherein said vapor drying agent is compatible with said cleaning agent, has an evaporation latent heat of 50 cal/g or less, has a boiling point of from 50° C. to 150° C., and includes no chlorine.

2. A method as claimed in claim 1, wherein said industrial part is at least one selected from the group consisting of a metallic part, a ceramic part, a glass part, a plastic part having a hard surface, a surface treated or coated part, an electric part, a semiconductor part, an optical part and a precision machinery part.

3. A method as claimed in claim 1, wherein said cleaning agent during step (a) removes waters from the surface of the industrial part.

4. A method as claimed in claim 1, wherein said cleaning agent during step (a) removes liquid from the surface of the industrial part.

5. A method as claimed in claim 1, wherein the cleaning agent comprises said aliphatic hydrocarbon cleaning agent.

6. A method of cleaning an industrial part comprising the steps of:
   (a) a step of cleaning said industrial part with a mixture containing a non-water base cleaning agent and a non-water cleaning power promoting agent,
   (b) a next step of cleaning said industrial part with a non-water base cleaning agent alone,
   wherein said base cleaning agent used in steps (a) or (b) comprises at least one non-water system agent selected from the group consisting of a silicon-containing cleaning agent and an aliphatic hydrocarbon cleaning agent having from 4 to 30 carbon atoms,
   wherein said silicon-containing cleaning agent comprises at least one low molecular weight polyorganosiloxane selected from the group consisting of a straight chain polyorganosiloxane represented by the formula:

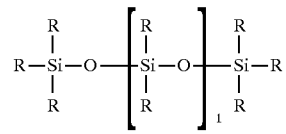

a cyclic polyorganosiloxane represented by the formula:

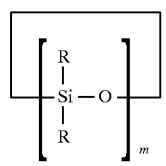

wherein R in each formula is a substituted or unsubstituted hydrocarbon group, 1 is an integer from 0 to 5, and m is an integer of from 3 to 7, and
   wherein said aliphatic hydrocarbon cleaning agent comprises at least one agent selected from the group consisting of a volatile isoparaffin having 4 to 30 carbon atoms, a volatile normal paraffin, and a volatile cyclo-olefin, and (c) a step of drying said industrial part by use of a vapor drying treatment after the step (b) of cleaning, wherein said drying is conducted with a non-water vapor drying agent which is different from said base cleaning agent of the step (b), and wherein said vapor drying agent is compatible with said base cleaning agent of step (b), has an evaporation latent heat of 50 cal/g or less, has a boiling point of from 50° C. to 150° C., and includes no chlorine.

7. A method as claimed in claim 6, wherein said cleaning power promoting agent comprises at least one agent selected from the group consisting of a surfactant and a hydrophilic solvent.

8. A method as claimed in claim 6, wherein said industrial part is at least one selected from the group consisting of a metallic part, a ceramic part, a glass part, a plastic part having a hard surface, a surface treated or coated part, an electric part, a semiconductor part, an optical part and a precision machinery part.

9. A method as claimed in claim 6, wherein the method is continuous and the base cleaning agent used in step (a) and the base cleaning agent used in step (b) are both recycled and reused during the method.

10. A method as claimed in claim 6, wherein said base cleaning agent and cleaning power promoting agent in said step (a) removes waters from the surface of the industrial part.

11. A method as claimed in claim 6, wherein said base cleaning agent and cleaning power promoting agent in said step (a) removes liquid which remains on the surface of the industrial part.

12. A method as claimed in claim 6, wherein the cleaning agent comprises said aliphatic hydrocarbon cleaning agent.

* * * * *